US010995857B2

(12) United States Patent
Avelar Araujo et al.

(10) Patent No.: US 10,995,857 B2
(45) Date of Patent: May 4, 2021

(54) PISTON RING FOR INTERNAL COMBUSTION ENGINES

(71) Applicants: MAHLE Metal Leve S/A, Jundiaí (BR); MAHLE International GmbH, Stuttgart (DE)

(72) Inventors: Juliano Avelar Araujo, Jundiaí (BR); Nuno Costa, Coimbra (PT); Paulo José Da Rocha Mordente, Jundiaí (BR); José Valentim Lima Sarabanda, Morumbi (BR)

(73) Assignees: MAHLE International GmbH, Stuttgart (DE); MAHLE Metal Leve S/A, Jundiaí (BR)

( * ) Notice: Subject to any disclaimer, the term of this patent is extended or adjusted under 35 U.S.C. 154(b) by 0 days.

(21) Appl. No.: 16/600,487

(22) Filed: Oct. 12, 2019

(65) Prior Publication Data
US 2020/0040996 A1 Feb. 6, 2020

Related U.S. Application Data

(63) Continuation of application No. PCT/EP2018/059318, filed on Apr. 11, 2018.

(30) Foreign Application Priority Data

Apr. 12, 2017 (BR) .................. 10 2017 007599 0

(51) Int. Cl.
F02F 3/00 (2006.01)
F16J 9/26 (2006.01)
(Continued)

(52) U.S. Cl.
CPC ............... F16J 9/26 (2013.01); C23C 14/025 (2013.01); C23C 14/0605 (2013.01);
(Continued)

(58) Field of Classification Search
CPC ... F16J 9/26; F16J 9/12; C23C 14/025; C23C 14/0605; C23C 14/505; C23C 14/542; C23C 14/588
(Continued)

(56) References Cited

U.S. PATENT DOCUMENTS 4,299,401 A * 11/1981 McCormick ............ B23P 15/08
277/440
5,380,018 A * 1/1995 Mader ........................ F16J 9/12
277/467

(Continued)

FOREIGN PATENT DOCUMENTS

CN 101365899 A 2/2009
CN 102345084 A 2/2012
(Continued)

OTHER PUBLICATIONS

International Search Report and Written Opinion of the European Patent Office in PCT/EP2018/059318 (from which this application claims priority) dated Jul. 24, 2018.
(Continued)

Primary Examiner — Hung Q Nguyen
Assistant Examiner — Anthony Donald Taylor, Jr.
(74) Attorney, Agent, or Firm — Falk Ewers; Ewers IP Law PLLC

(57) ABSTRACT

A piston ring for internal combustion engines provided with a ferrous alloy base includes an annular outer surface on which a coating including at least one outer layer is applied deposited on an adhesive layer, the outer layer being provided with a variable thickness, in such a way that the thickness of the outer layer gradually increases from 90° and 270° towards 0° and 360° respectively, with the thickness attaining its maximum value in the region of 10° and 350° and slightly decreasing towards 0° and 360° so as to ensure
(Continued)

an optimal working condition, minimizing the contact pressure and consequently the accelerated wear in the vicinities of the ends of the ring, in addition to preventing and/or impeding the detachment of the outer layer of the coating.

9 Claims, 4 Drawing Sheets

(51) Int. Cl.
    *C23C 14/02*     (2006.01)
    *C23C 14/06*     (2006.01)
    *C23C 14/50*     (2006.01)
    *C23C 14/54*     (2006.01)
    *C23C 14/58*     (2006.01)
    *F16J 9/12*     (2006.01)

(52) U.S. Cl.
    CPC .......... *C23C 14/505* (2013.01); *C23C 14/542* (2013.01); *C23C 14/588* (2013.01); *F16J 9/12* (2013.01)

(58) Field of Classification Search
    USPC ....................................................... 123/193.4
    See application file for complete search history.

(56) References Cited

U.S. PATENT DOCUMENTS

| | | | |
|---|---|---|---|
| 8,857,820 B2 | 10/2014 | Herbst-Dederichs et al. | |
| 9,163,726 B2* | 10/2015 | Favaron | F16J 9/22 |
| 9,611,543 B2* | 4/2017 | Kennedy | C23C 16/0281 |
| 9,644,738 B2 | 5/2017 | Kunimoto et al. | |
| 9,759,322 B2 | 9/2017 | Araujo et al. | |
| 9,863,534 B2* | 1/2018 | Ozaki | C23C 14/325 |
| 9,927,029 B2 | 3/2018 | Wu et al. | |
| 2004/0056425 A1* | 3/2004 | Miida | C23C 14/505 |
| | | | 277/459 |
| 2008/0095939 A1* | 4/2008 | Fischer | C23C 14/0641 |
| | | | 427/255.394 |
| 2008/0136116 A1 | 6/2008 | Sarabande et al. | |
| 2011/0101620 A1* | 5/2011 | Hoppe | C23C 28/044 |
| | | | 277/442 |
| 2011/0256366 A1* | 10/2011 | Hoppe | F16J 10/04 |
| | | | 428/213 |
| 2012/0228831 A1* | 9/2012 | Herbst-Dederichs | F16J 9/26 |
| | | | 277/434 |
| 2013/0004756 A1* | 1/2013 | Kennedy | C23C 16/26 |
| | | | 428/216 |
| 2013/0042845 A1* | 2/2013 | Kennedy | C23C 28/044 |
| | | | 123/668 |
| 2013/0140776 A1* | 6/2013 | Kennedy | C23C 14/325 |
| | | | 277/442 |
| 2013/0200572 A1 | 8/2013 | Cha et al. | |
| 2013/0307221 A1* | 11/2013 | Esser | F16J 9/12 |
| | | | 277/434 |
| 2013/0316156 A1* | 11/2013 | Kennedy | C23C 16/26 |
| | | | 428/213 |
| 2014/0096736 A1* | 4/2014 | Barenreuter | F16J 9/26 |
| | | | 123/193.6 |
| 2014/0323368 A1* | 10/2014 | Avelar Araujo | C23C 14/0641 |
| | | | 508/105 |
| 2015/0018254 A1* | 1/2015 | Araujo | C23C 28/046 |
| | | | 508/105 |
| 2015/0240944 A1* | 8/2015 | Ivanov | F16J 9/26 |
| | | | 277/443 |
| 2015/0362071 A1* | 12/2015 | Ivanov | C23C 28/32 |
| | | | 277/442 |
| 2016/0122862 A1* | 5/2016 | Lammers | C23C 14/0641 |
| | | | 277/443 |

FOREIGN PATENT DOCUMENTS

| | | | | |
|---|---|---|---|---|
| CN | 103789725 A | | 5/2014 | |
| CN | 104271802 A | | 1/2015 | |
| CN | 104903631 A | | 9/2015 | |
| EP | 263317 A1 | | 4/1988 | |
| EP | 2940350 A1 | | 11/2015 | |
| JP | 2016216821 A | | 12/2016 | |
| KR | 20130091053 A | | 8/2013 | |
| WO | WO2008000573 | * | 1/2008 | ............. C23C 14/06 |
| WO | 2011057875 A1 | | 5/2011 | |
| WO | 2014194874 A1 | | 12/2014 | |
| WO | 2016055498 A1 | | 4/2016 | |

OTHER PUBLICATIONS

Office Action and Search report dated Jun. 15, 2020 issued in Chinese counterpart application No. 201880024781.4 and English-language translation thereof.

\* cited by examiner

PISTON RING FOR INTERNAL COMBUSTION ENGINES

CROSS REFERENCE TO RELATED APPLICATIONS

This application is a continuation application of international patent application PCT/EP2018/059318, filed Apr. 11, 2018, designating the United States and claiming priority to Brazilian application BR 10 2017 007599 0, filed Apr. 12, 2017, and the entire content of both applications is incorporated herein by reference.

TECHNICAL FIELD

The present disclosure relates to a piston ring for internal combustion engines provided with a coating of variable thickness that offers high durability due to the excellent resistance to wear obtained in the most critical regions of the ring.

BACKGROUND

Piston internal combustion engines, like almost all current conventional automotive engines (petrol, alcohol, Flex, VNG or diesel), include at least one piston ring. Piston rings act in sealing the combustion chamber, distributing and controlling oil and in dissipating the heat absorbed by the pistons during combustion, conducting it to the engine block.

Currently, there is a tendency for engines to operate at high temperatures, pressures and rotational speeds, so that the piston rings are subject to increasingly greater loads, which creates a demand for ideas to reduce wear and friction, improve sealing and increase breaking strength.

Piston rings are, generally, formed of a metal base that includes an outer surface on which at least one coating layer is applied, suitable for entering into contact with the cylinder wall. The function of the coating is most important, since it seeks to confer on the ring properties of low sliding friction, high wear resistance, high fracture toughness, hardness and thermal stability and resistance to thermal fatigue and contact.

Usually, the application of coating layers is performed by ion coating processes, especially by physical vapor deposition (PVD), chemical vapor deposition (CVD) or by a galvanic coating process.

By means of studies, tests and simulations, the applicant is able to note that piston rings, specifically compression rings, undergo premature wear in the regions adjacent to the ends or in the ends of the ring themselves.

Thus, some documents are found in the prior art that seek to find solutions for offering greater durability in these most critical regions of the ring.

A representative prior art is the document US 2004/056425 which relates to a piston ring and a method for manufacturing a piston ring that comprises a coating layer of variable thickness, the coating layer being 1.5 to 4 times thicker in the regions of the ends of the ring than the coating layer applied along the region away from the vicinities of the ends of the ring.

The method disclosed by the document US 2004/056425 comprises a PVD process and has a variable rotational speed, so that the speed is minimal, when the region of the ends of the ring is facing the source of coating material, causing the thickness in the region of the vicinity of the ends of the ring to be greater than the thickness of the coating in the region opposite the ends of the ring. However, this process requires a very precise and controlled synchronization during this variation in speeds, since, otherwise, the effect of varying the thickness of the coating is not achieved.

The document WO 2014/194874 relates to a piston ring and to a method for producing a piston ring, the ring including a body of cast iron or cast steel on which is deposited, by a PVD process, a coating layer of variable thickness, so that the coating layer is thicker in the regions of the ends of the ring and the body of the ring is worked so that, in a cold operating state with the engine off, the radial pressure distribution in the body of the ring is such that the ends thereof exhibit substantially no radial pressure through a defined circumferential angle, and the variable thickness of the coating layer is determined so that it exhibits a substantially uniform radial pressure distribution present along the whole circumference of the piston ring when at temperatures above 150° C.

But the increase in the coating layer in the region of the vicinity of the ends of the ring is not sufficient for ensuring greater durability of the component. As illustrated in FIG. 2, the thicker the coating layer is in the regions in the vicinities of the ends of the ring, the greater the contact pressure is between the ends of the ring and the engine block cylinder. Combustion generates high temperatures and an increase in gas pressure, leading to premature wear that is further aggravated by the condition of low lubrication and contact pressure between the sliding surfaces of the compression ring and this same region.

The solutions found in the prior art seek to ensure greater durability for the piston ring by increasing the coating layer in the regions of the vicinities of the ends of the ring.

However, it is important to note the difficulty encountered in building thick coating layers. Growing coating layers is complex for two main reasons:

Very long process time. For obtaining layers of at least 30 micrometers thick, it takes about 24 hours of machine operation, just for covering.

Very high stress state. The greater the thickness of the coating layer, the greater the stress state which leads to detachment and spalling when in contact.

This makes it necessary to find a piston ring provided with a coating that includes an outer layer of variable thickness deposited on an adhesion layer, so that the outer layer offers high durability due to excellent wear resistance and to low sliding friction, and the adhesion layer offers the necessary adhesion of the outer layer to the outer surface of the piston ring, together with a high thickness of the outer layer in the most critical regions of the ring.

SUMMARY

An objective of the present disclosure is to provide a piston ring for internal combustion engines provided with a metal base that includes an outer surface on which a coating including at least one outer layer is applied deposited on an adhesion layer, the outer layer being provided with a variable thickness through the fact that the outer layer 6 is formed of amorphous carbon a-C; provided with a variable thickness in which the ratio between the point with a less thick layer and the point with the thicker layer is from 0.20 to 0.50, while the outer layer 6 is deposited on at least one adhesion layer 5.

It is also an objective of the present disclosure to provide a piston ring provided with a coating that includes an outer layer of variable thickness, in such a way that the thickness of the outer layer gradually increases from 90° and 270° towards 0° and 360°, respectively, with the thickness attaining its maximum value in the region of 10° and 350°, and decreasing slightly towards 0° and 360°, so as to ensure an optimal working condition, minimizing the contact pressure and consequently the accelerated wear in the vicinity of the ends of the ring.

It is, moreover, an objective of the present disclosure to provide a piston ring provided with a coating that includes an outer layer of variable thickness applied by a process of physical vapor deposition (PVD).

The objectives of the present disclosure are achieved by a piston ring for internal combustion engines provided with a ferrous alloy base including an annular outer surface on which a coating that includes at least one outer layer is applied formed of amorphous carbon a-C; provided with a variable thickness in which the ratio between the point with a less thick layer and the point with a thicker layer is from 0.20 to 0.50, while the outer layer 6 is deposited on at least one adhesion layer 5.

The objectives of the present disclosure are further achieved by a piston ring that includes an opening provided with two ends, being a first end and a second end, a first half defined by a portion of the outer surface adjacent to the opening, from 0° to 90° and from 270° to 360°, a second half defined by a portion of the outer surface opposite the opening, from 90° to 270°, the first half exhibiting a thickness gradient of the outer layer, the outer layer being thicker in the adjacent regions of the vicinities of the first and second ends, with a reduction in the thickness of the outer layer in the regions of the vicinities of the first and second ends, the second half exhibiting a uniform thickness of the outer layer, the outer layer including a thickness of at least 10 micrometers in the second half of the ring, gradually becoming thicker and attaining a thickness of at least 30 micrometers in the adjacent regions of the vicinities of the first and second ends of the ring, the regions of the vicinities of the first and second ends including the outer layer from 2% to 10% less thick than in the adjacent regions of the vicinities of the first and second ends of the ring, the outer surface being a sliding surface and the piston ring referring to a first piston groove compression ring and/or a second piston groove compression ring.

The objectives of the present disclosure are, moreover, achieved by an internal combustion engine that includes at least one piston ring, as described above.

BRIEF DESCRIPTION OF THE DRAWINGS

The disclosure will now be described with reference to the drawings wherein.

DESCRIPTION OF EXEMPLARY EMBODIMENTS

Figure 1:
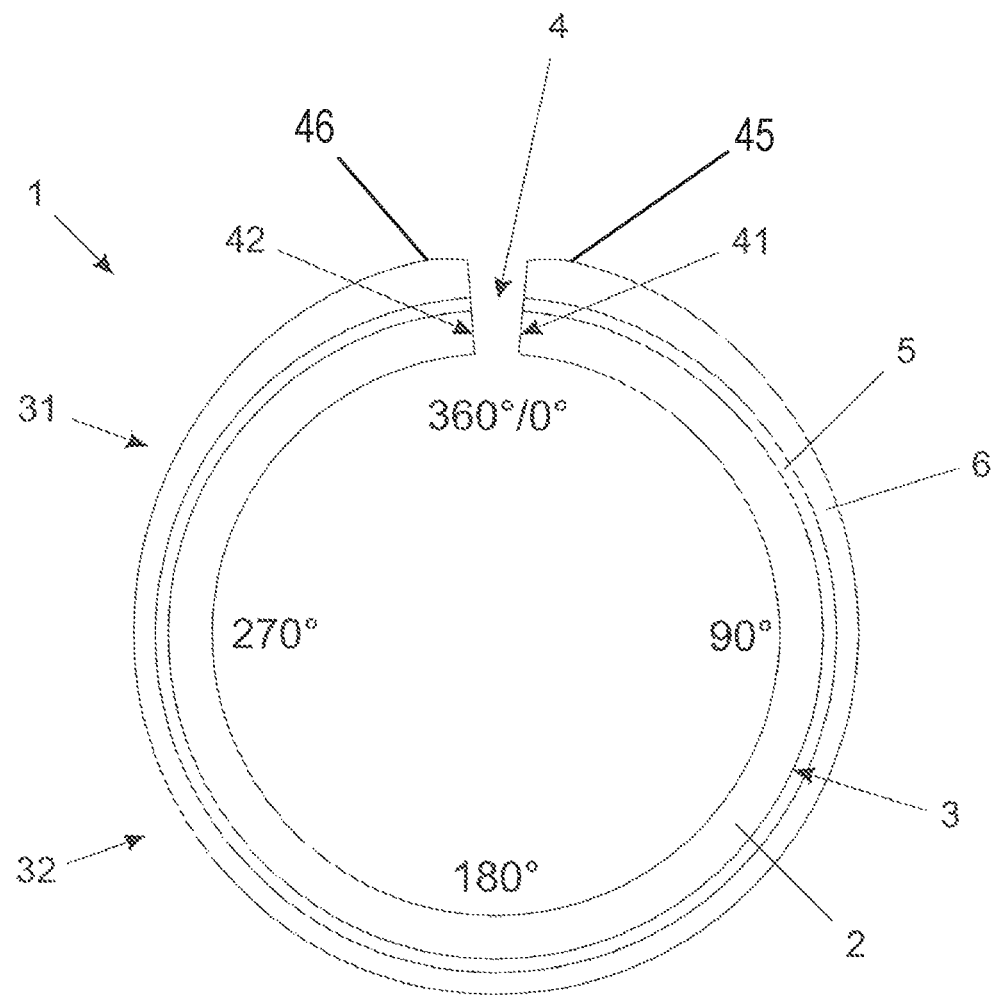
FIG. 1 shows a schematic representation of a piston ring including the coating of the present disclosure.
Figure 2:
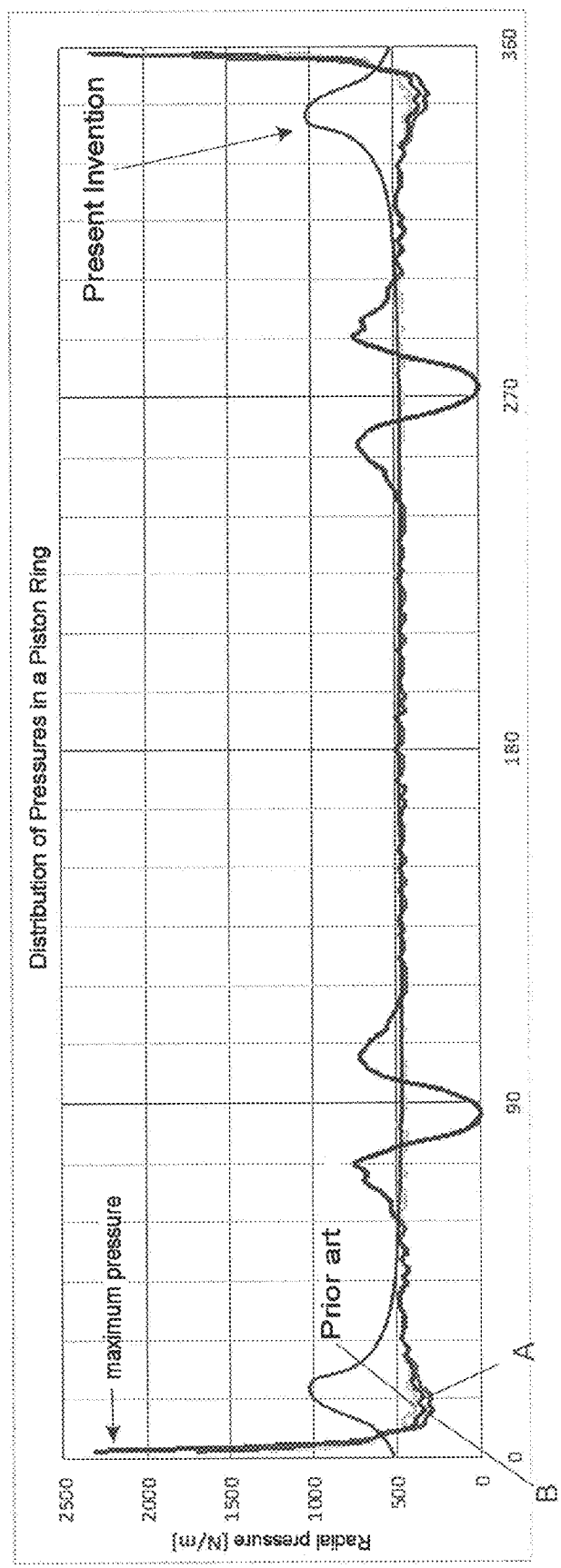
FIG. 2 shows a graphical representation of the distribution of pressures from 0° to 360° for a piston ring.

The present disclosure relates to a piston ring 1 for internal combustion engines provided with a ferrous alloy base 2 that includes an annular outer surface 3 on which a coating including at least one outer layer 6 is applied deposited on at least one adhesive layer 5, the outer layer 6 being provided with a variable thickness, in such a way that the thickness of the outer layer 6 gradually increases from 90° and 270° towards 0° and 360° respectively, with the thickness attaining its maximum value in the regions 45 and 46 at angles of 10° and 350°, respectively, and slightly decreasing towards 0° and 360° so as to ensure an optimal working condition, minimizing the contact pressure and consequently the accelerated wear in the vicinities of the ends of the ring, in addition to preventing and/or impeding the detachment of the outer layer 6 of the coating.

The piston rings 1 are, as a rule, provided with an opening 4, the existence of which ensures the possibility of fitting the ring 1 in a groove of a piston for internal combustion engines. For better defining the present disclosure, the region of the opening 4 of the ring 1 is defined by two ends, being a first end 41 and a second end 42, also known as the extremities of the ring. Taking, for example, the center of the opening 4, the opening 4 is assumed to comprise an angle of 10°. Thus, the center of the opening 4 is defined as the zero degree 0° or 360° angle so that each end 41, 42 is 5° from the center of the opening 4.

In this context, the limit of the first end 41 is positioned at 5° from the center of the opening 4 and the limit of the second end 42 is positioned at 355° from the center of the opening 4, or −5° from this same center. For a better understanding of the present disclosure, the degrees must be measured in a clockwise direction starting from the center of the opening 4 of the piston ring 1.

In a very simple way, which will be better explained in the course of the text, the process for obtaining the coating of the present disclosure consists in performing a first deposition, by means of a process of physical vapor deposition (PVD), on substantially half of the outer surface 3 of the ring 1, followed by a second deposition, also by PVD, on the entire outer surface 3 of the ring 1, the first deposition and the second deposition being capable of alternating therebetween.

More specifically, the first deposition is performed in the region of the ring 1 including the areas defined by the angles 0° to 90° and 270° to 360° counting from the center of the opening 4 of the ring 1. Alternatively, it may be said that the surface that receives the first deposition is defined by the 180° adjacent to the center of the opening 4. These 180° adjacent to the center of the opening 4 are hereinafter referred to as a first half 31 of the ring 1. The opposite portion of the ring 1 is hereinafter referred to as a second half 32 and naturally comprises the portion of the outer surface 3 defined by the angles from 90° to 270° opposite the center of the opening 4.

As can be observed in FIG. 1, the piston ring 1 is provided with a base 2 that includes an annular outer surface 3, this surface acting as a sliding portion on the interface between the ring 1 and a cylinder liner. The ring 1, illustrated in the present disclosure, typically includes a first piston groove compression ring or even a second piston groove compression ring.

The piston ring 1 of the present disclosure has a form such that the first half 31 includes a thickness gradient of the outer layer 6 of the coating, starting from at least 10 micrometers, from 90° and 270°, and ending in at least 30 micrometers in the adjacent regions of the vicinities of the ends 41, 42 of the ring 1.

In an alternative typical configuration, the outer layer 6 includes a thickness of at least 5 micrometers in the second half 32 of the ring 1, gradually becoming thicker and attaining a thickness of at least 10 micrometers in the adjacent regions 45 and 46 in the vicinities of the first and second ends 41, 42 of the ring 1, respectively, the maximum layer in these regions being 60 micrometers.

Typically, but not necessarily, in a typical configuration the outer layer 6 is provided with a variable thickness in which the ratio between the point with a less thick layer and the point with a thicker layer is from 0.20 to 0.50, the outer layer 6 being deposited on at least one adhesion layer 5.

It should be noted that the vicinities of the ends 41, 42 have an outer layer 6 that is about 2% to 10% less thick than the adjacent regions of the vicinities of the ends 41, 42. Thus, the vicinity of the first end 41 has a thickness of at least 30 micrometers and the vicinity of the second end 42 a thickness of at least 30 micrometers. Moreover, the second half 32 of the ring, from 90° to 270°, has an outer layer 6 with a uniform thickness of at least 10 micrometers.

As mentioned previously, it is of the utmost importance that the difficulty of building thick coating layers should be investigated.

The outer layer 6 is formed of amorphous carbon a-C. To some extent, the challenge in building thick layers of chromium nitride (CrN) and amorphous carbon a-C is similar. However, due to the characteristics inherent to the material, thick layers of amorphous carbon a-C are even more difficult to build.

Growing coating layers is complex for two main reasons:
Very long process time. In order to achieve the thickness of at least 30 micrometers for the outer layer 6 formed of amorphous carbon a-C a process time of about 24 hours of machine operation is necessary, just for covering.
Very high stress state. The greater the thickness, the greater the stress state which leads to detachment and to spalling of the outer layer 6 when in contact with an engaging sliding surface.

As the demand from engines is for greater wear resistance, due to high mechanical and thermal loads, this makes it necessary for piston rings to offer, among other characteristics, high wear resistance. Due to the geometric configuration of the rings, the first and second ends 41, 42 are the most critical and most stressed areas, requiring a thicker coating layer. Accordingly, the outer layer 6, formed of amorphous carbon a-C, comprises a thickness of at least 30 micrometers deposited in the vicinity of the first and second ends 41, 42.

In this respect, the conventional solutions, found in the prior art, have high costs, for energy expenditure and processing time, and have low durability due to the detachment and spalling of the outer layer 6.

Thus, the piston ring 1 of the present disclosure includes at least one adhesion layer 5 deposited between the outer surface 3 and the outer layer 6, functioning as an intermediate adhesion layer.

The adhesion layer 5 is of metal composition, typically, but not necessarily, formed of chromium (Cr), and includes a thickness equal to or greater than 5% of the thickness of the outer layer 6, when taken at 180° from the first and second ends 41, 42.

The adhesion layer 5, as its name suggests, ensures the adhesion of the outer layer 6 to the outer surface 3 of the base 2 of the ring 1, preventing and/or impeding the detachment and spalling of the outer layer 6. The adhesion layer 5 includes, typically, a thickness of between 0.1 and 1.2 micrometers, preferably a thickness of 1 micrometer, capable of ensuring the necessary robustness for the coating.

For obtaining the piston ring 1, the PVD coating process of the present disclosure is performed in a chamber 55 especially suited to this type of deposition, including at least one source 52 of coating material 53 and at least one turntable 50 on which is fixed at least one piston ring 1.

The chamber 55 includes, typically, but not necessarily, an even number of sources 52 of coating material 53. Alternatively, the present disclosure may consist of an odd number of sources 52, the selection between one, two, three, four, five, six, seven, eight, nine, ten, etc. sources 52 depending on each project and need. In a possible embodiment exemplified by FIG. 3, 4 or 5, four sources may be arranged symmetrically and equidistantly, so as to make possible a balanced deposition for all the parts to be coated. In short, in a simplistic way, the number of sources 52 varies regardless of the number of rings 1.

With regard to the number of rings to be deposited, there is no limitation apart from the area available on the turntable, it being possible for one ring 1 or a plurality thereof to be deposited. The greater the number of sources 52, the greater will be the speed of deposition of the coating material 53 and, therefore, the greater the efficiency of the process.

With regard to the turntable 50, its rotation may be either clockwise or anticlockwise. Moreover, in assigning a first rotation movement W1 of the turntable 50 and a second rotation movement W2 of the piston ring 1 it should be mentioned that both may rotate in alternate directions or in the same direction, which may be clockwise or anticlockwise.

Figure 3:
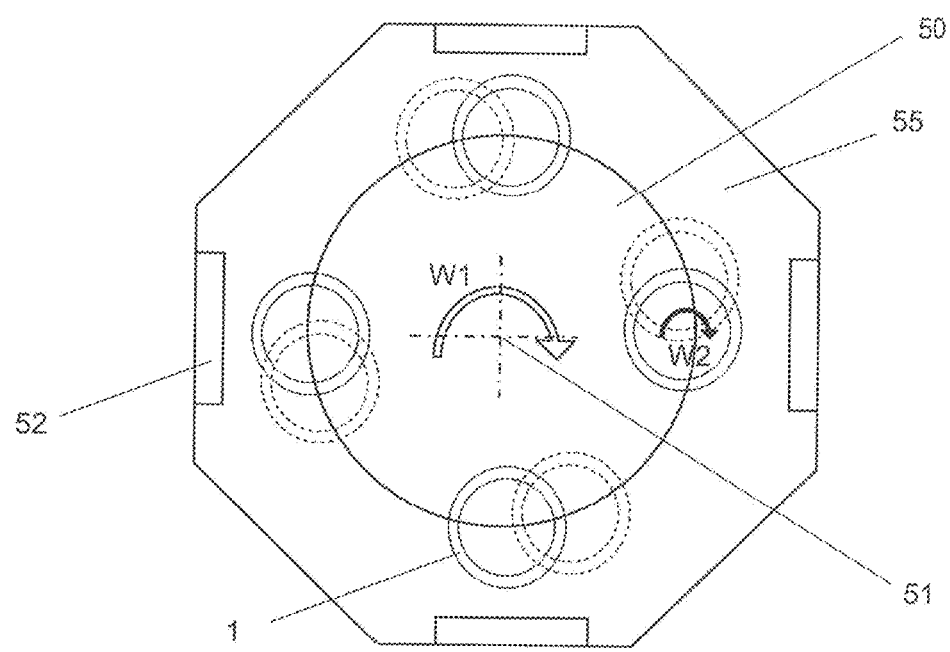
FIG. 3 shows schematic representation of the PVD process of the prior art.

Usually, the PVD process for coating piston rings, illustrated in FIG. 3, includes the attachment of at least one ring 1 onto a turntable 50 so that the turntable performs a first rotation movement W1 about its central axis 51 and the ring 1 performs a second rotation movement W2 on the turntable 50, the ring 1 receiving a deposition of coating material along the whole outer surface 3, from 0° to 360°.

The coating process provided by the present disclosure includes the application of a coating by a PVD process performed in at least two steps, which may be alternated with respect to the sequence of implementation.

Figure 4:
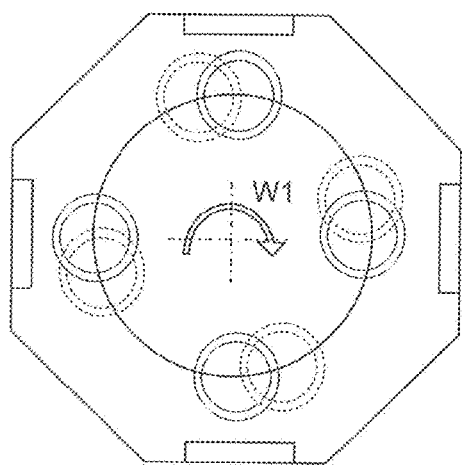
FIG. 4 shows schematic representation of step 1 of the PVD process of the present disclosure.

As can be observed in FIG. 4, in step 1 of the coating process, the piston ring 1 is attached to the turntable 50 so that the first half 31 of the ring 1 is facing the source 52 of coating material 53. In this step, only the turntable 50 performs the first rotation movement W1 about the central axis 51, while the ring 1 remains stationary in relation to the turntable 50. The objective of this first step is a first deposition of the coating material 53 and achieves about ⅔ (two-thirds) of the final thickness of the outer layer 6.

Figure 5:
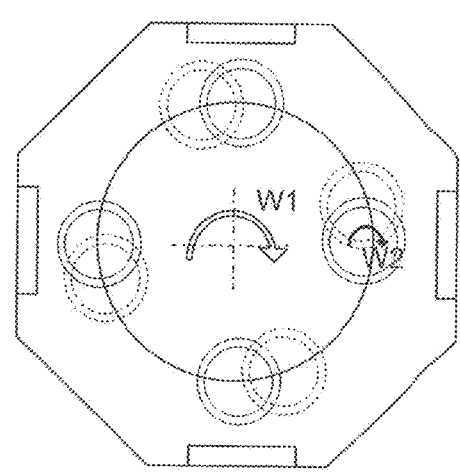
FIG. 5 shows a schematic representation of step 2 of the PVD process of the present disclosure.

In step 2 of the process, represented in FIG. 5, both the rotary table 50 and the ring 1 perform a rotation movement. The turntable 50 performs a first rotation movement W1 about the central axis 51, while the ring 1 performs a second rotation movement W2 on the turntable 50. In this step, a second deposition of coating material 53 takes place along the whole outer surface 3 from 0° to 360° of the ring 1. Thus, the first half 31 of the ring 1 attains the final thickness of the outer layer 6 which will be thicker in relation to the second half 32 of the ring 1. Alternatively it should be noted that, between step 1 and step 2, the rings may undergo a finishing process, which may be machining, lapping, grinding, fine grinding, honing, brushing, inter alia.

Figure 6:
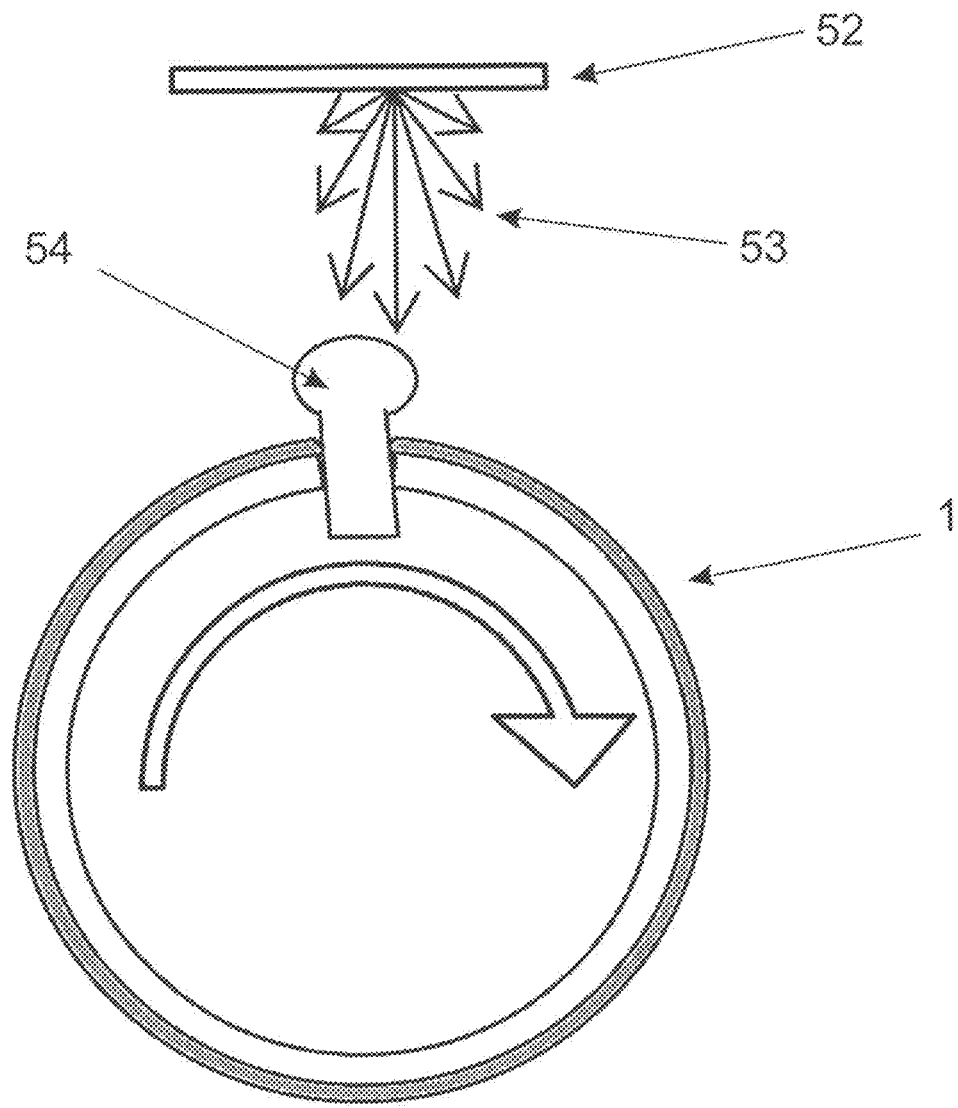
FIG. 6 shows a schematic representation of the use of a physical barrier in the PVD process of the present disclosure.

In FIG. 6, it is observed that the PVD coating process ensures that the thickness of the outer layer 6 in the vicinity of the first end 41 and in the vicinity of the second end 42 is typically, but not necessarily, between 2% and 10% less than the thickness of the outer layer 6 in the adjacent regions of the vicinities of the first ends 41, 42 of the ring 1.

In a typical construction, a physical barrier 54 is inserted between the ends 41, 42 of the opening 4 of the ring 1 so as to block a fraction of the coating material 53 applied by the source 52, thus achieving a reduction in the thickness of the outer layer 6 in the vicinity of the first end 41 and in the vicinity of the second end 42 of the opening of the ring 1.

In a second configuration, the reduction in the thickness of the outer layer 6 in the vicinities of the ends 41, 42 of the opening 4 is obtained by a machining process so as to remove the material after the coating process. Preferably, but not necessarily, the machining processes used are brushing or lapping.

The reduction in the thickness of the outer layer 6 in the vicinities of the ends 41, 42 is aimed at reducing the contact pressure, so as to allow a better lubrication and, consequently, less wear of the ring 1.

Dividing the PVD coating process into two steps allows the process parameters to be adjusted so as to reduce the compressive stresses applied during the deposition of the material 53.

Furthermore, the process of the present disclosure makes it possible for different materials to be applied during the first and the second step. For example, in the first step a material of high wear resistance may be applied, while in the second step a material with low sliding friction and less wear resistance may be applied.

While a typical embodiment has been described, it should be understood that the scope of the present disclosure embraces other possible variations, being limited only by the content of the appended claims, including the possible equivalents therein.

What is claimed is:

1. A piston ring for an internal combustion engines, the piston ring comprising:
    a ferrous alloy base including an annular outer surface on which a coating that includes at least one outer layer is applied,
    the at least one outer layer being formed of amorphous carbon a-C and deposited on at least one adhesion layer, the at least one outer layer having a variable thickness along a circumference of the piston ring,
    wherein a ratio that corresponds to the circumference of the piston ring between first points on the at least one outer layer at circumferential angles of 90° and 270° and second points on the at least one outer layer in vicinities of circumferential angles of 0° and 360° is from 0.20 to 0.50, and such that the thickness of the at least one outer layer gradually increases from the first points to the second points.

2. The piston ring according to claim 1, wherein the at least one adhesion layer is formed of chromium.

3. The piston ring according to claim 1, wherein the at least one adhesion layer has a thickness equal to or greater than 5% of the thickness of the at least one outer layer at a circumferential angle of 180°.

4. The piston ring according to claim 1, wherein the at least one adhesion layer has a thickness of between 0.1 and 1.2 micrometers.

5. The piston ring according to claim 1, further comprising:
    a first end and a second end of the piston ring forming an opening therebetween with a center of the opening at the circumferential angles 0° and 360°;
    a first half of the piston ring including the opening being defined by the circumferential angles from 270° to 360° and from 0° to 90° in a clockwise direction; and
    a second half of the piston ring excluding the opening being defined by the circumferential angles from 90° to 270° in the clockwise direction, wherein:
    the at least one outer layer has a thickness at the second points in regions at circumferential angles of 10° and 350° which is reduced towards the first and second ends of the piston ring, and
    the at least one outer layer has a uniform thickness in the second half of the piston ring.

6. The piston ring according to claim 5, wherein the at least one outer layer has a thickness of at least 5 micrometers in the second half of the piston ring, and from the first points to the second points, the at least one outer layer gradually becomes thicker until attaining a thickness of at least 10 micrometers at the second points, and such that a maximum thickness in the regions at the circumferential angles of 10° and 350° is 60 micrometers.

7. The piston ring according to claim 1, wherein the annular outer surface is a sliding surface.

8. The piston ring according to claim 1, wherein the piston ring relates to a first piston groove compression ring and/or a second piston groove compression ring.

9. An internal combustion engine comprising at least one of the piston ring according to claim 1.

* * * * *

UNITED STATES PATENT AND TRADEMARK OFFICE
CERTIFICATE OF CORRECTION

| | | |
|---|---|---|
| PATENT NO. | : 10,995,857 B2 | Page 1 of 1 |
| APPLICATION NO. | : 16/600487 | |
| DATED | : May 4, 2021 | |
| INVENTOR(S) | : Juliano Avelar Araujo et al. | |

It is certified that error appears in the above-identified patent and that said Letters Patent is hereby corrected as shown below:

On the Title Page

On Page 2:
<u>Under "FOREIGN PATENT DOCUMENTS":</u>
Replace "EP 263317 A1" with "EP 2963317 A1"

In the Claims

<u>For Column 7, Claim 1:</u>
Line 35: Replace "combustion engines," with "combustion engine,"

Signed and Sealed this
Third Day of December, 2024

Katherine Kelly Vidal
*Director of the United States Patent and Trademark Office*